United States Patent
Liu

(10) Patent No.: US 7,977,960 B2
(45) Date of Patent: Jul. 12, 2011

(54) CANTILEVER TYPE PROBE HEAD HAVING INTRODUCING PORTION WITH END FACE HAVING A TAPERED PORTION AND AN EXTENDED RECTANGULAR PORTION

(75) Inventor: Shih-Ming Liu, Taipei (TW)

(73) Assignee: ALLSTRON Inc., Taipei (TW)

( * ) Notice: Subject to any disclaimer, the term of this patent is extended or adjusted under 35 U.S.C. 154(b) by 61 days.

(21) Appl. No.: 12/423,525

(22) Filed: Apr. 14, 2009

(65) Prior Publication Data

US 2010/0259290 A1    Oct. 14, 2010

(51) Int. Cl.
*G01R 31/00* (2006.01)
(52) U.S. Cl. .......... 324/755.07; 324/755.01; 324/755.11
(58) Field of Classification Search .................. None
See application file for complete search history.

(56) References Cited

U.S. PATENT DOCUMENTS

| 6,633,176 | B2 * | 10/2003 | Takemoto et al. | 324/754 |
| 6,842,023 | B2 * | 1/2005 | Yoshida et al. | 324/754 |
| 7,148,709 | B2 * | 12/2006 | Kister | 324/754 |
| 2006/0171425 | A1 * | 8/2006 | Lee et al. | 372/1 |

* cited by examiner

*Primary Examiner* — Minh N Tang
(74) *Attorney, Agent, or Firm* — Muncy, Geissler, Olds & Lowe, PLLC

(57) ABSTRACT

A cantilever type probe head, the head at least includes a probe having an introducing portion for contacting a pad of a member to be probed, the introducing portion is a conical column with its end face having a tapered portion and an extended rectangular portion, the tapered portion and the extended rectangular portion are provided in a coplanar position at the end face on the introducing portion.

11 Claims, 6 Drawing Sheets

CANTILEVER TYPE PROBE HEAD HAVING INTRODUCING PORTION WITH END FACE HAVING A TAPERED PORTION AND AN EXTENDED RECTANGULAR PORTION

BACKGROUND OF THE INVENTION

1. Field of the Invention

The present invention relates to a cantilever type probe head, and more particularly to a cantilever type probe head having conical columns, in order that when the probe head contacts a pad of a member to be probed, a better effect of indication in contacting and guiding can be attained, the probe head suits measuring of a high frequency integrated circuit or some other electronic element.

2. Description of the Prior Art

There have been various probe assemblies for measuring integrated circuits or micro electronic elements, wherein a representative assembly uses an electric circuit card, its upper side is formed elongate conductor traces used as signal and grounding lines, the card is formed thereon a central opening, the tips of probes are attached to the ends of the signal traces near by the opening, thereby the probes are aligned radially and pointing downwards, in order to be optionally connected by a pad of a micro electronic element to be tested.

Recently, electronic circuits are equipped in large amounts with IC's, according to strengthening in functions, increasing of amount and reducing of volume of the products, number of pins of the IC's is increased and gathered, this renders the test after processing of manufacturing more complicated, thereby probes used presently has insufficiency in structural designing, such as are stated below:

1. The contact surface of a probe "A" used presently with a pad is designed rectangular or circular with one end of it tapered (as shown in FIGS. 1 and 1a), if the pad is oxidized to form an oxidized layer, the probe shall be pressed with a large force to pierce the oxidized layer, this often will destroy the pad inadvertently.

2. Design of a rectangular or circular contact surface "B" is almost same in shape as that printed on the pad, so that when in measuring, the contact surface "B" of the probe forms a parallel surface in opposition to that of the pad, thereby a user is uneasy to assure whether the probe "A" is aligned or contacted with the pad.

3. When the rectangular or circular contact surface "B" is worn away after using for a period of time, the contact surface will deform, and even the area of the contact surface "B" of the probe "A" will be getting larger and be unable to pierce the oxidized layer of the pad for electric connecting, thus the entire probe "A" must be changed.

In view of the above stated, the inventor provides the present invention after study, development and improvement.

SUMMARY OF THE INVENTION

The primary object of the present invention is to provide a cantilever type probe head, when the probe head contacts a pad of a member to be probed, a better effect of indication in contacting and guiding can be attained.

Another object of the present invention is to provide a cantilever type probe head of which the shape and area of the contact surface can be kept when the probe is worn away after contact.

In order to achieve the above objects, the cantilever type probe head of the present invention at least includes a probe having an introducing portion for contacting the pad of the member to be probed, the introducing portion is a conical column with its end face having a tapered portion and an extended rectangular portion, the tapered portion and the extended rectangular portion are provided in a coplanar position at the end face on the introducing portion.

When in practicing, the introducing portion of the probe is bended for an angle, and when the end face of the probe slightly overdrives the pad and obliquely form contact with the latter, the tapered portion contacts the pad firstly.

The present invention will be apparent after reading the detailed description of the preferred embodiment thereof in reference to the accompanying drawings.

DETAILED DESCRIPTION OF THE PREFERRED EMBODIMENT

Figure 1A:
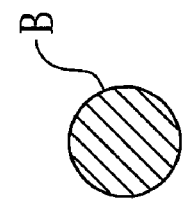
FIG. 1A is a sectional view of a contact surface of a conventional probe to contact with a pad.
Figure 1:
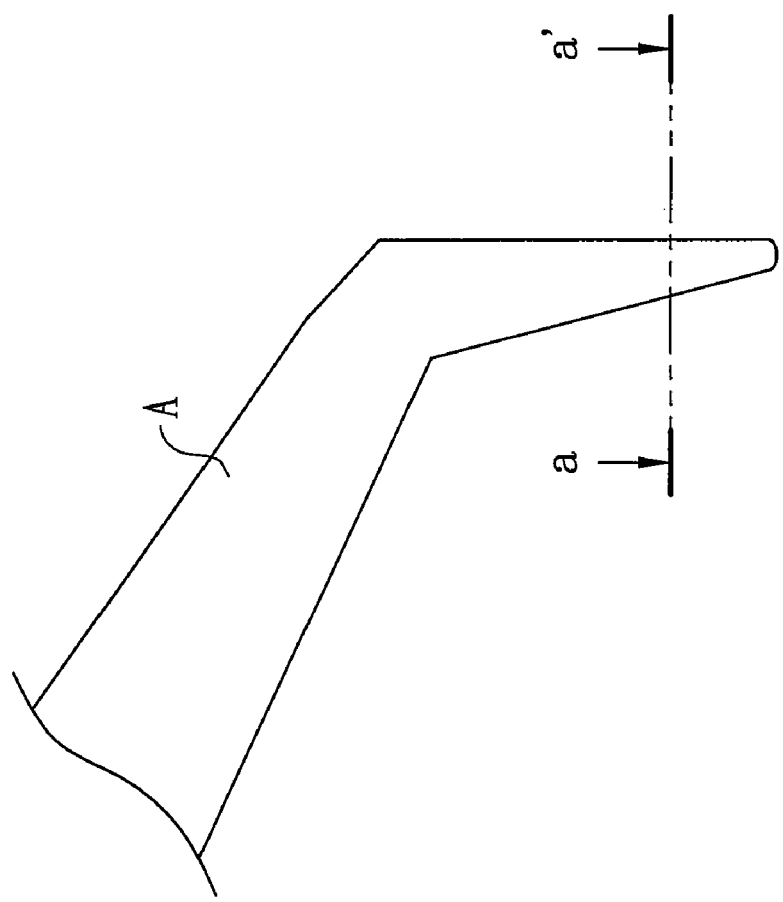
FIG. 1 is a perspective view showing the appearance of a conventional probe.
Figure 2A:
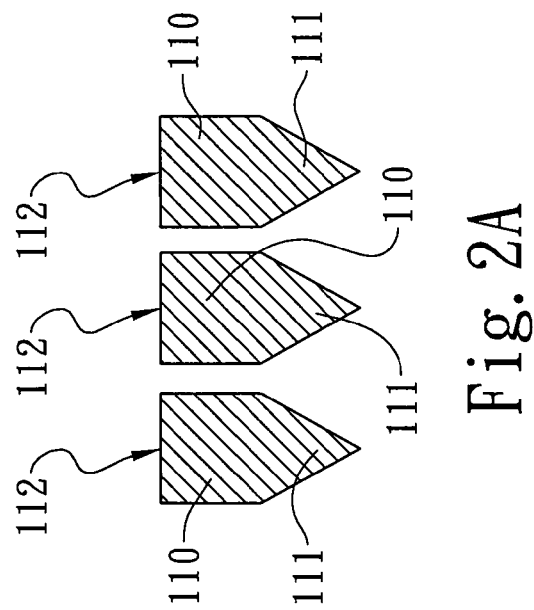
FIG. 2A is a sectional view of end faces of a plurality of introducing portions on a plurality of probes of the embodiment of the present invention.
Figure 2:
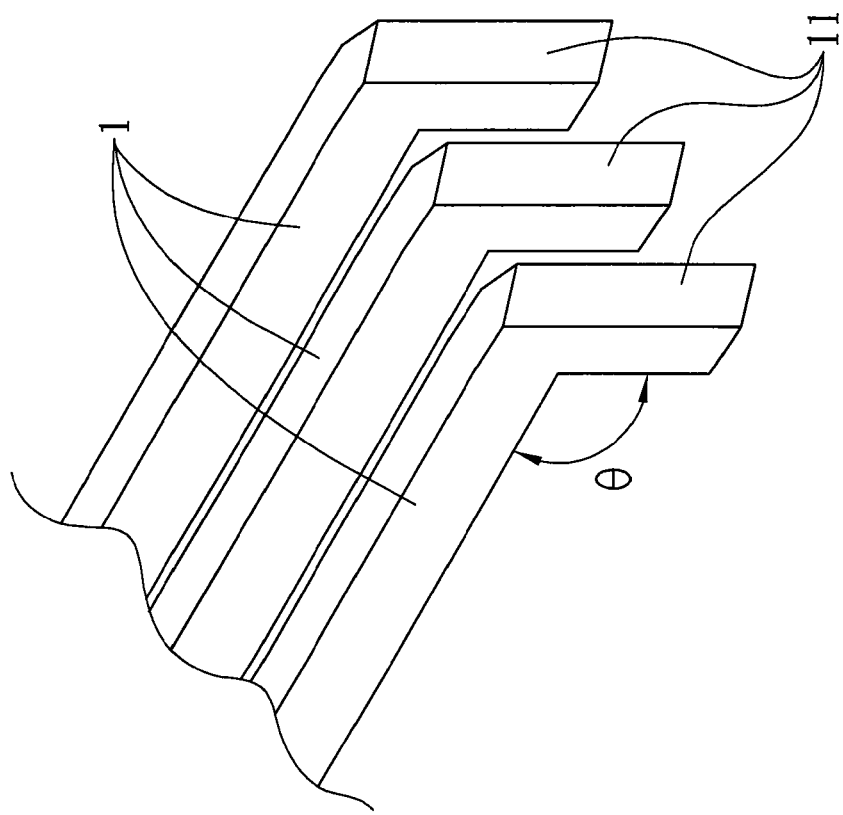
FIG. 2 is a perspective view showing the appearance of a plurality of the probes of an embodiment of the present invention.
Figure 3:
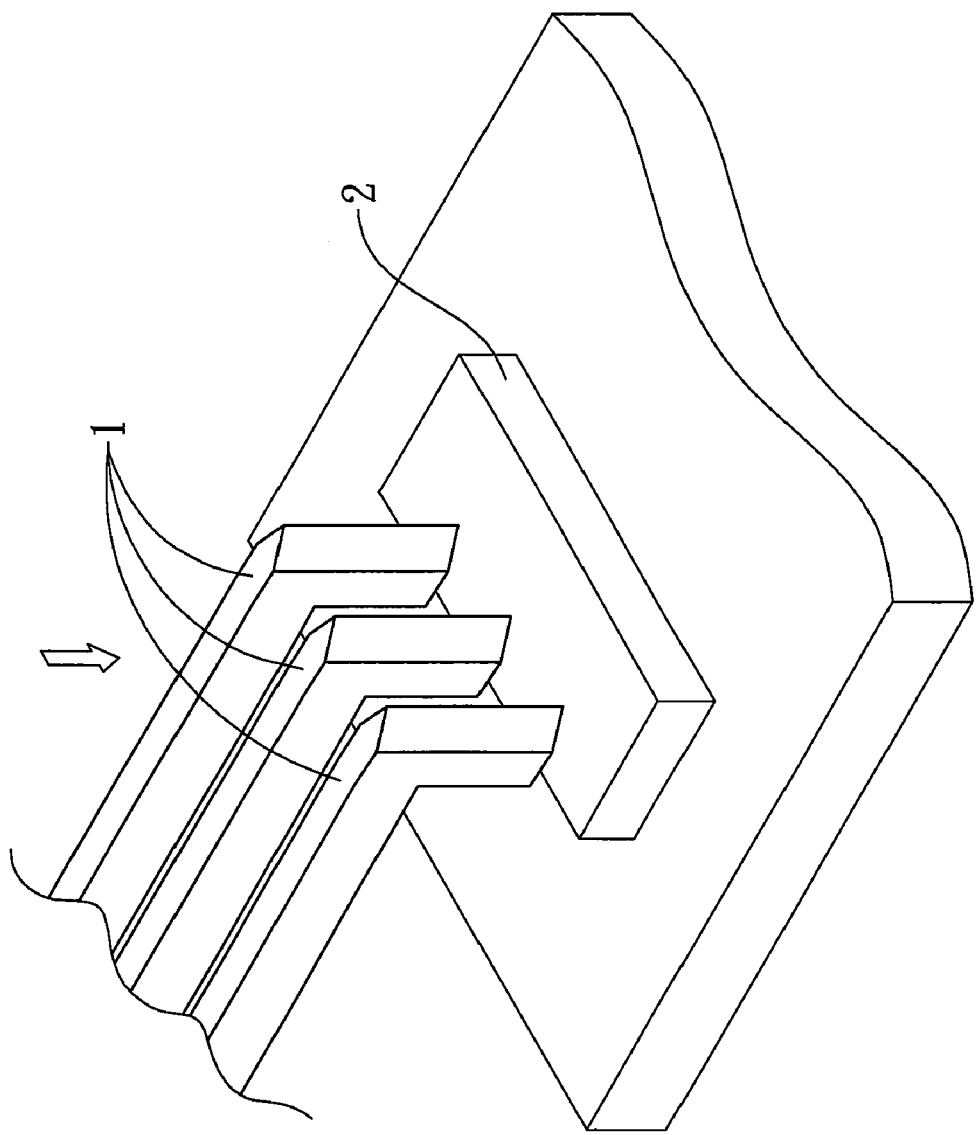
FIG. 3 is a perspective view showing the state of use in measuring of the probes of the embodiment of the present invention.
Figure 3A:
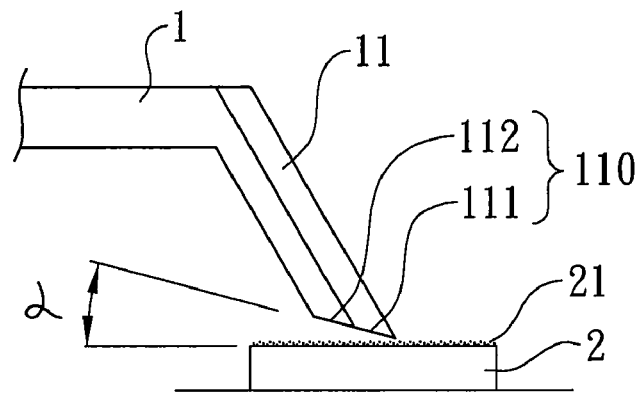
FIG. 3A is a perspective view showing the state in preparing measuring of a probe of the embodiment of the present invention.

Referring to FIGS. 2 and 3 showing the embodiment of a cantilever type probe head of the present invention, the head includes a plurality of probes 1.

The probes 1 each has an introducing portion 11 for contacting a pad 2 of the member to be probed, the introducing portions 11 are a plurality of conical columns with their end faces 110 each having a tapered portion 111 and a rectangular portion 112, the tapered portions 111 and the rectangular portions 112 are all provided in a coplanar position at the end faces 110 on the introducing portions 11, and the introducing portions 11 are bended each for an angle θ.

Figure 4:
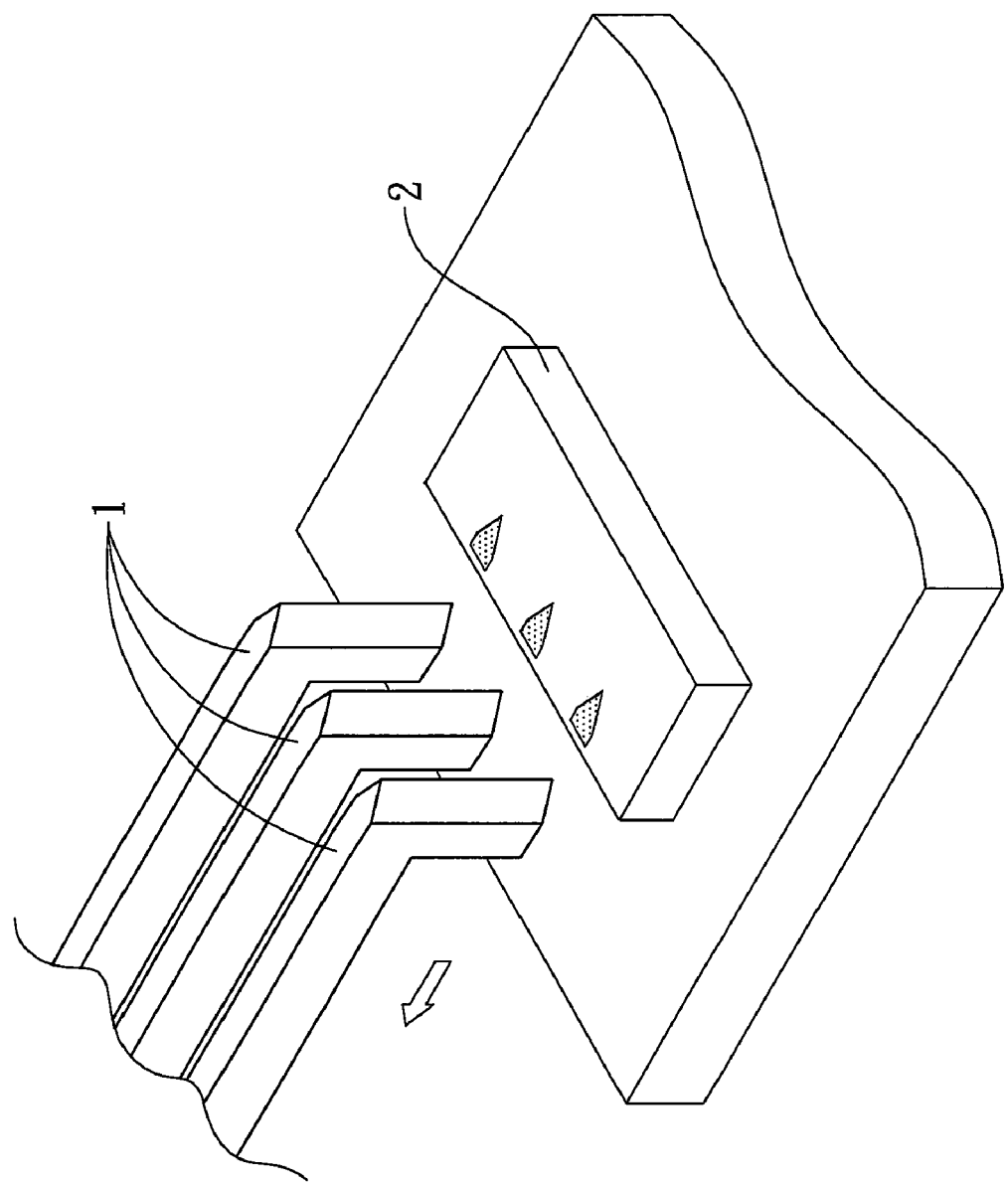
FIG. 4 is a perspective view showing the state after measuring of the probes of the embodiment of the present invention.
Figure 5:
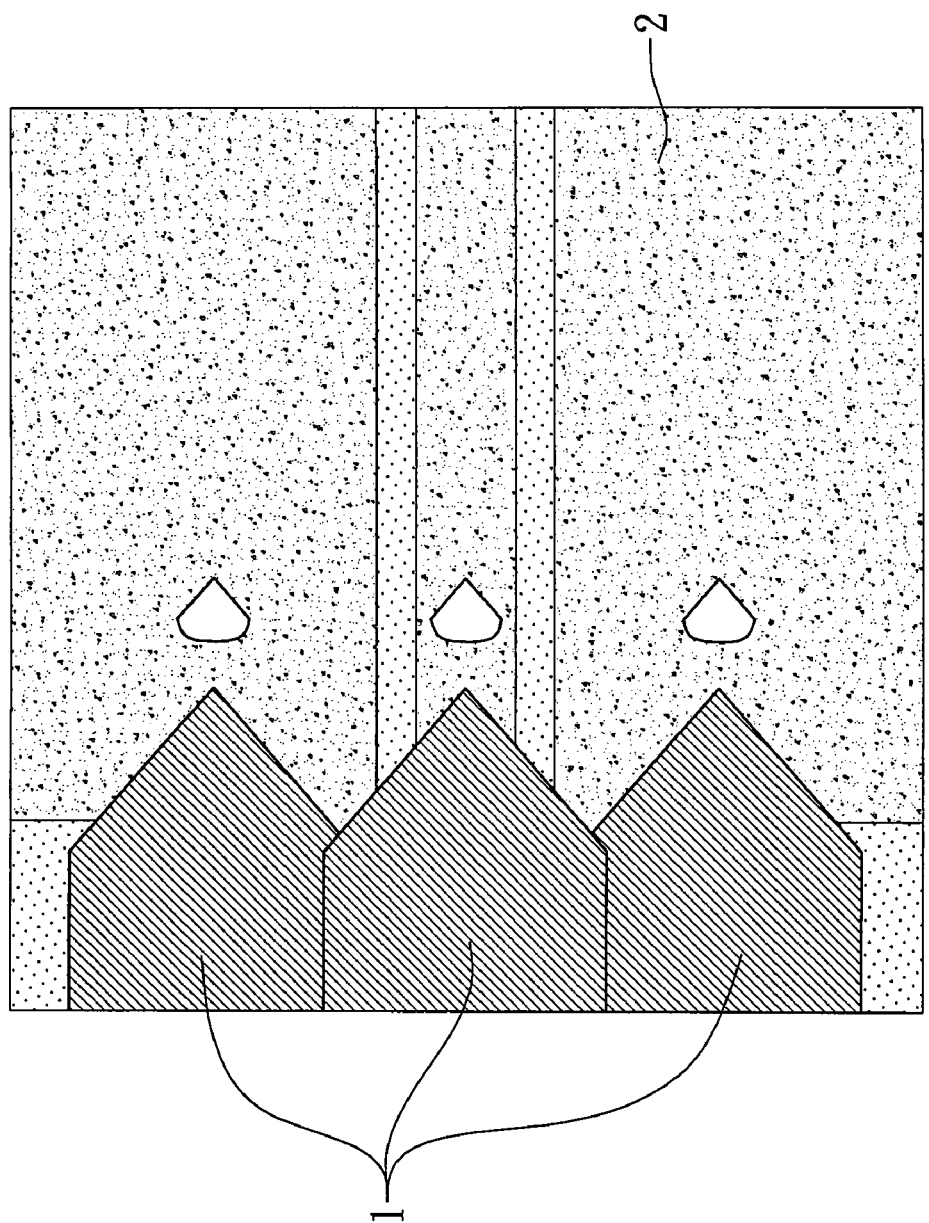
FIG. 5 is an enlarged perspective view showing the state after measuring of the probes of the embodiment of the present invention.

Therefore, as shown in FIGS. 3-5, when the probes 1 of the present invention are mounted on a probe supporting member of a detector, they can be moved to suitable positions to allow the end faces 110 of the introducing portions 11 of the probes 1 to contact a pad 2 of an individual component on a member to be probed (such as a chip).

Figure 3B:
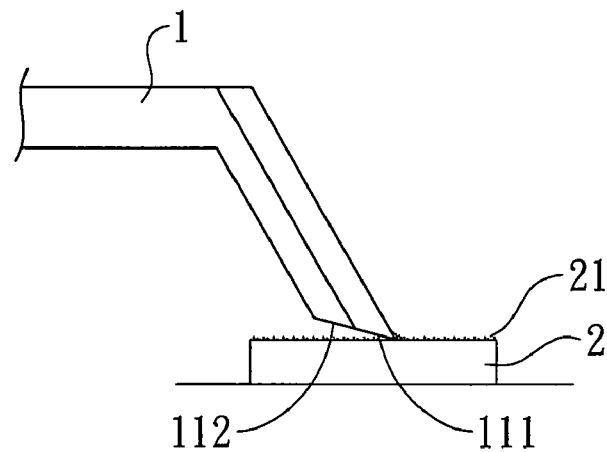
FIG. 3B is a perspective view showing the state in measuring of the probes when a tapered portion pierces an oxidized layer of the embodiment of the present invention.
Figure 3C:
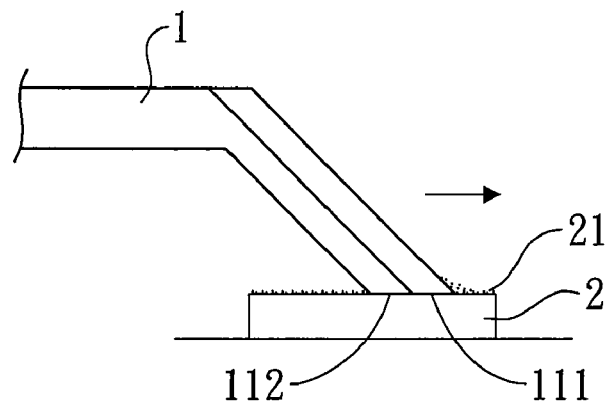
FIG. 3C is a perspective view showing the state in contacting of the probes of the present invention with a clean pad.

When in contacting the pad 2, the end faces 110 of the introducing portions 11 of the probes 1 are in a position having an angle α to the pad 2, and the tapered portions 111 contact the pad 2 firstly (as shown in FIG. 3) when the probes 1 slightly overdrive the pad 2, the tapered portions 111 on the end faces 110 of the introducing portions 11 of the probes 1 can pierce into the an oxidized layer 21 of the pad 2, design of the tapering makes the probes 1 easy to break the pad 2 (as shown in FIG. 3B), now to increase the overdriving force, the set of cantilever type probe head of the present invention will deform to make the end faces 110 of the introducing portions 11 nearly parallel to the surface of the pad 2 (as shown in FIG. 3C), so that the rectangular portions 112 get large contact area to contact with the clean pad 2 to thereby increase accuracy of measuring; meantime, when a user observes the process through a microscope, by the design of the tapered portions 111 on the end faces 110 of the introducing portions 11 of the probes 1, he can clearly see whether the probes 1 are aligned with the pad 2. Additionally, when the end faces 110 of the introducing portions 11 of the probes 1 make the pad 2 worn by repeated measuring, with the design of the conical columns, the end faces 110 still can keep their tapered portions 111 and rectangular portions 112.

Therefore, the present invention has the following advantages:

1. The present invention has an idea of designing that the introducing portions of the probes are a plurality of conical columns with their end faces each having a tapered portion and an extended rectangular portion, thereby when the probes contact a pad, the tapered portions of the probes can pierce the oxidized layer of the pad, and an object of convenient contacting with the pad can be attained, this can increase the accuracy of measuring after contacting, and even can lower the risk of destroying the pad by using a large force to pierce the oxidized layer as is the case of conventional probes.
2. The present invention is provided with the tapered portions on the end faces of the introducing portions of the probes, so that when in measuring, a user is convenient to observe whether the probes are correctly aligned with the pad, this is beneficial to operation.
3. The introducing portions of the probes of the present invention are conical columns, their end faces can keep their tapered portions and rectangular portions even when the end faces are worn after long time using, so that the probes can have prolonged length of use.

In conclusion, according to the description disclosed above and the drawings, the present invention surely can achieve the expected objects thereof to provide a cantilever type probe head that can allow better contact and provide indication for guiding when the probe head contacts a pad of a member to be probed.

The above stated is the preferred embodiment of the present invention and the technical measures used for it; it will be apparent to those skilled in this art that various modifications or changes can be derived according to the disclosure and description of the present invention, while the equivalent modifications or changes without departing from the spirit of this invention shall also fall within the scope of the appended claims.

The invention claimed is:

1. A cantilever type probe head comprising:
   at least a probe, said probe has an introducing portion for contacting a pad of a member to be probed, said introducing portion has an end face with a tapered portion and an extended rectangular portion, said tapered portion and said extended rectangular portion are provided in a coplanar position at said end face on said introducing portion.
2. The cantilever type probe head as in claim 1, wherein: said introducing portion of said probe is bended for an angle.
3. The cantilever type probe head as in claim 1, wherein: said tapered portion contacts said pad firstly when said end face of said probe slightly overdrives said pad and obliquely form contact with said pad.
4. The cantilever type probe head as in claim 1, wherein: said introducing portion is a conical column.
5. The cantilever type probe head as in claim 1, wherein: the end face is a pentagon.
6. The cantilever type probe head as in claim 1, wherein: the end face has more than four sides in the some plane.
7. The cantilever type probe head as in claim 1, wherein: the introducing portion flexes when the end face engages a pad to thereby change an inclination of the end face.
8. The cantilever type probe head as in claim 7, wherein: the end face has more than four sides in the same plane.
9. The cantilever type probe head as claim 1, wherein: the coplanar tapered portion and extended rectangular portion both simultaneously contact a pad.
10. The cantilever type probe head as claim 1, wherein: all of a surface of the end face is engageable with a pad.
11. The cantilever type probe head as in claim 1, wherein: said introducing portion of said probe is bent at an angle, and
    said tapered portion contacts said pad firstly when said end face of said probe slightly overdrives said pad and obliquely form contact with said pad.

* * * * *